(12) United States Patent
Alves, Jr. et al.

(10) Patent No.: US 10,001,512 B2
(45) Date of Patent: Jun. 19, 2018

(54) INDIVIDUALIZED SELF-MONITORING SYSTEM FOR TRANSFORMERS IN POWER MEASUREMENT INSTALLATIONS AND METHOD OF MONITORING AND DIAGNOSING TRANSFORMERS IN POWER MEASUREMENT INSTALLATIONS

(75) Inventors: José Eduardo da Rocha Alves, Jr., Rio de Janeiro (BR); Luiz Carlos Grillo de Brito, Rio de Janeiro (BR); Cesar Jorge Bandim, Rio de Janeiro (BR); Fabio Cavaliere de Souza, Rio de Janeiro (BR); Julio Cesar Reis dos Santos, Rio de Janeiro (BR)

(73) Assignee: Centro de Pesquisas de Energia Elétrica—CEPEL, Rio de Janeiro, RJ (BR)

( * ) Notice: Subject to any disclaimer, the term of this patent is extended or adjusted under 35 U.S.C. 154(b) by 545 days.

(21) Appl. No.: 12/992,565

(22) PCT Filed: May 13, 2009

(86) PCT No.: PCT/BR2009/000128
§ 371 (c)(1),
(2), (4) Date: Mar. 4, 2011

(87) PCT Pub. No.: WO2009/137902
PCT Pub. Date: Nov. 19, 2009

(65) Prior Publication Data
US 2011/0153244 A1    Jun. 23, 2011

(30) Foreign Application Priority Data
May 13, 2008    (BR) ...................................... 0801469

(51) Int. Cl.
*G01R 19/00*    (2006.01)
*G01R 19/25*    (2006.01)
(Continued)

(52) U.S. Cl.
CPC ......... *G01R 19/2513* (2013.01); *G01R 21/06* (2013.01); *G01R 22/063* (2013.01)

(58) Field of Classification Search
CPC ...... H04B 3/54; G01R 19/2513; G01R 21/06; G01R 22/063
(Continued)

(56) References Cited

U.S. PATENT DOCUMENTS 2,218,668 A  *  10/1940  Wagner .......................... 324/127
4,709,339 A       11/1987  Fernandes
(Continued)

FOREIGN PATENT DOCUMENTS

BR    MU 8303368-8      7/2005
BR    PI 0402716 7      1/2006
(Continued)

OTHER PUBLICATIONS

ABB Power Distribution, REF542plus Manual Part 3: Installation and Commissioning, DMS Oct. 4, 2001.*
(Continued)

*Primary Examiner* — Stephanie Bloss
(74) *Attorney, Agent, or Firm* — McDonnell Boehnen Hulbert & Berghoff LLP

(57) ABSTRACT

The present invention relates to an individualized self-monitoring system for transformers (31, 33) in a electric power measurement installation that comprises at least a transformer (31, 33) and at least a time-integrated electrical quantity meter (3, 4, 13), directly coupled to one of the windings of the transformer (31, 33), the meter (3, 4, 13) being capable of measuring and recording the electrical quantity of said winding.
The present invention also relates to a method of monitoring and diagnosing transformers (31, 33) in a power measurement installation that comprises the steps of measuring the
(Continued)

values of at least a directly measured time-integrated electrical in at least a winding of at least one transformer (31, 33), performing comparisons between the measured and generating diagnostic results with the compared data.

46 Claims, 14 Drawing Sheets

(51) Int. Cl.
    *G01R 21/06* (2006.01)
    *G01R 22/06* (2006.01)
(58) Field of Classification Search
    USPC .......................................................... 702/64
    See application file for complete search history.

(56) References Cited

U.S. PATENT DOCUMENTS

| | | | |
|---|---|---|---|
| 5,737,730 A * | 4/1998 | Alvarenga et al. | 705/412 |
| 5,924,051 A | 7/1999 | Provost et al. | |
| 6,507,184 B1 * | 1/2003 | Elston | 324/107 |
| 6,671,635 B1 | 12/2003 | Forth et al. | |
| 2006/0033488 A1 | 2/2006 | Gandhi | |
| 2008/0109387 A1 * | 5/2008 | Deaver et al. | 705/412 |

FOREIGN PATENT DOCUMENTS

| | | |
|---|---|---|
| BR | PI 0505840 6 | 9/2007 |
| CA | 2423417 A1 | 9/2004 |
| EP | 0466453 A2 | 1/1992 |
| GB | 2248307 A | 4/1992 |
| GB | 2424286 A | 9/2006 |
| WO | 99/60415 A1 | 11/1999 |
| WO | 2005036281 A1 | 4/2005 |

OTHER PUBLICATIONS

European Patent Office, Written Opinion of the International Searching Authority for International Application No. PCT/BR2009/000128, dated Nov. 2, 2009.

European Patent Office, International Preliminary Report on Patentability for International Application No. PCT/BR2009/000128, dated Jul. 14, 2010.

European Patent Office, International Search Report for International Application No. PCT/BR2009/000128, dated Nov. 2, 2009.

IEEE, IEEE Standard Requirements for Instrument Transformers, IEEE Std. C57.12, Jul. 28, 2008, 94 pages.

Close, Charles M.; The analysis of linear circuits, published by Harcourt, Brace & World Inc., 1966, Section 5.4, pp. 250-257 plus 2 cover pages (10 sheets total). The year of publication (i.e., 1966) of this non-patent literature document is sufficiently earlier than the effective U.S. filing date and any foreign priority date so that the particular month of publication is not in issue.).

* cited by examiner

INDIVIDUALIZED SELF-MONITORING SYSTEM FOR TRANSFORMERS IN POWER MEASUREMENT INSTALLATIONS AND METHOD OF MONITORING AND DIAGNOSING TRANSFORMERS IN POWER MEASUREMENT INSTALLATIONS

The present invention relates to an individualized, constant self-monitoring system for transformers in an electric power measurement facility of a distribution and/or transmission electric power network, through which on-going readings of time-integrated electric current and voltage on power measurement transformers are performed for purposes of billing or operational measurement of electric power. The present invention further relates to a method of monitoring and diagnosing these transformers, which is capable of making function diagnoses, such as operating failures and irregularities in the network based on electric current and voltage readings from electric power measurement transformers.

BACKGROUND OF THE INVENTION

Electric power distribution management by electric utilities in many countries is affected by a matter that involves the values of the total losses of electric power, comprised by portions known as "commercial losses" and "technical losses", which present values well above the international average and acceptable values for the kind of service being paid properly, causing economic losses to society as a whole.

"Technical losses" originate from the passage of electric current through equipment and distribution networks, such as Joule effect losses in the conductors, losses in Watts in the transformer and reactor cores, in the capacitor banks, etc, being inherent in any system of transmission and distribution of electric energy.

"Commercial (non-technical) losses" are created by fraud in measurement systems, power diversion before measurement, illegal connections, billing errors in processing, defective measuring equipment, and registration problems, among others.

In order to combat and reduce these losses, utilities have made use of various technologies and work processes, often involving high investment and operating costs without adequate return. Due to its greater complexity, these solutions also have installation and maintenance costs much higher than those incurred by conventional connections. Additionally, as a regulatory point of view, these losses have not been totally incorporated in the tariff revisions and readjustments, many utilities have difficulty in making greater investments to step up the battle against power losses, characterizing a vicious circle often difficult to break to achieve a better management program and reduce the losses.

A major difficulty faced in monitoring and identifying possible actions designed to cause underinvoicing of real consumption of electric power consumers is the broad range of electrical load variation, characterized in that the electric current varies practically from zero to the current capacity limit of the circuit to which it is connected. For example, any reduction in the current value may have been produced by an action seeking to cause underbilling of consumption, due to failure or defect in the measurement system or said loads may truly have been disconnected. This type of action, which acts on the electric current quantity in the electric power facilities where the consumer units are measured, is a frequent cause of commercial losses of electric utilities, either by diversions in the branch connection (before measurement by the utility) or at the billing measurement system facilities.

The consumption units or substations that have high installed electric power make use of transformers for billing or operating measurement instruments, either for use with potential transformers and current transformers together, or for use with current transformers only. These are traditionally known as indirect measurement facilities.

Currently, the current transformers installed for operational or billing measurement of consumption units or substations having indirect measurement do not have any internal monitoring information that allows the effective and on-going verification whether the current signal that feeds external electric power meters or other instruments arranged to measure the consumption at the substation or consumption unit is being adequately transferred.

From the secondary windings of the current transformers to the inside of electric power meters, various irregularities by way of frauds may occur, such that the electric power values recorded by these meters are lower than those genuinely consumed by a consumption unit. These frauds, applied to the current signal, might short-circuit the secondary conductors that connect the secondary windings of said current transformers to the electric power meters, insert bypasses in the current circuit coming from the test switches, short-circuit the coils or current circuits inside the electric power meters, etc. Moreover, it is important to point out that these actions can be intermittent or temporary, and in some situations not even an inspection is able to determine that frauds are being used, since they are withdrawn prior to inspection. These are often put back in place when the utility's teams leave the consumption unit site after an inspection. These actions are designed to cover up an irregularity which masks a reduction in consumption.

The reduction in the value of electric current measured that circulates in the current transformer may be caused by simple load disconnection, by connection error (on purpose or not) in the current transformers or in the respective secondary conductors, or by the use of frauds or irregularities, so as to cause underinvoicing in the consumption of electric power real recorded by the meter that measures the consumption at the substation or consumption unit, sometimes making it difficult to prove, even by legal actions, that wrongful acts have taken place, chiefly in the case of temporary irregularities.

The most modern electronic meters of electric power already known in the state of the art have mass storage and are able to present a load curve and detect idle currents, as disclosed, for example, in North American patent U.S. Pat. No. 5,924,051, owned by General Electric Company, related to a meter's capacity record load curves. However, the simple confirmation of an idle current is not sufficient to prove fraud, since it could be caused by a load reduction.

Some techniques are designed to implement an inspection by way of instantaneous current meters, such as, for example, that described in the utility model application number MU 8303368-8 U which describes a system for comparing instantaneous currents and real time communication to assess diversions or irregularities in the distribution facility. Said application is based on detecting diversions of instantaneous currents and does not use the accumulated current for this function, causing the need for digital storage memory for storing information of instantaneous currents or the use of a communication system between the stations in order to make real time comparison.

There are also techniques that use the already widely known principle of measuring the difference in current between the secondary windings of two current transformers, as described in patent application PI0505840-6 A, to indicate deviations of current. Nevertheless, such technique, besides not being applied to cases of indirect measurement of billing, does not quantify consumptions of the Ampere-hour (Ah) quantity, which is equivalent to the time-integrated electric current, does not monitor potential failures in the current transformers, needs a dedicated power source, is not capable of identifying current diversions inside the electric power meters and also does not have the characteristics of inviolability of the present invention. This document also fails to identify tampering in the measurement system caused by wrongful acts in circuits for potential measurement, as embodied by the present invention, by means of recording the Volt-hour (Vh) quantity.

Some techniques try to monitor secondary circuits of the current transformers by means of injection of signals and their respective reception, as described in patent GB 2424286 A, there being the need for an additional and specific detector to identify possible tampering, which makes this solution more complex, besides not guaranteeing the identification of diversions inside the current circuit of the electric power meter and also not permitting the appropriate quantification of the consumptions of Ampere-hour (Ah) quantity. The aforementioned patent does not identify tampering in the measurement system associated with wrongful acts on the potential circuits by means of recording the Vh quantity, limiting the field of application.

Additionally, any failures in the current transformer cause an undesirable error in the transformation ratio. For example, a short-circuit between coils in the secondary current may make the nominal primary current/secondary current ratio decrease. If on-going monitoring is in place, this defect can be detected more quickly, with greater sensitivity and not just during periodical inspections.

Regarding both inductive and capacitive potential transformers, actions often occur aiming to provide under-recording of the real consumption measurement of the consumption unit. These actions may be the interruption of the secondary conductor that powers the potential circuit of the electric power meter to the insertion of voltage dividers in the respective circuits or even inside the meter, so as to cause underinvoicing of the real electric power consumed.

The most modern electronic meters known in the state of the art have the capacity to detect any voltage drops. Document WO9960415, assigned by ABB, for example, describes an apparatus and a method for detecting possible tampering in potential circuits by determining the displacement between the between the voltage distribution of the meter, but only applied in the case of measurement by means of two elements, three wires. In said patent, the voltage reductions applied to the meter, produced by unlawful means, are not also recorded in the potential transformers by means of the Volt-hour (Vh) meter.

Moreover, in many situations, the utility does not possess a record of voltages throughout the entire distribution and/or transmission system, and is unable to confirm, by comparison, whether the information on voltage drops stored in the meter are the result of unlawful actions, interruptions or faults in the distribution and/or transmission system or in the potential circuit of the meter, meaning it is hard to prove potentially unlawful acts.

An alternative found normally to minimize losses in indirect measurement installations consists of installing instruments outside the consumption units in the transformers, oftentimes encapsulated with the electronic power meters and accessory units for tele-measurement, in a single casing, as shown, for example, in document PI0402716, related to manufacturing processes of remote measurement sets. This solution often costs various times the value of a traditional measurement, besides requiring special groups for installation, maintenance, checking and field calibration, which are carried out in a live line in medium voltage distribution networks. The calibration service, for example, has to be performed in a public area, with the use of ladders and under different weather conditions, making this task, which is required by regulatory standards, complex, laborious and expensive.

Besides, this technique does not comprise permanent monitoring of the current or potential transformers already installed. This technique also presents as a difficulty and a disadvantage the fact that when failures occur in some of the assembly components, chiefly in the potential transformers and current transformers, or in cases of increase or reduction of contract load, the apparatus needs to be completely replaced, including all the costs as previously mentioned, besides additional complete sets for replacement stock.

It is also noted that current transformers do not have in their body or casing any means that shows information about the angular displacement (phase shift) between the secondary current and the primary current, when the transformers are in operation. Currently, this information is obtained by means of precision testing most often carried out in pre-set loading conditions of the current transformer and the respective secondary loads imposed upon its winding.

Accordingly, unless the current transformer is withdrawn for testing or by way of a complete field test procedure, it is not possible to make a real time evaluation of the performance of the current transformer considering the phase angle error to be a relevant aspect.

Therefore, the current technique consists of withdrawing the current transformer for laboratory testing of the angular displacement, and incurs costs of transporting, disassembling, reassembling, and also the risk of inappropriate handling. The precision curve of the current transformer can only be adjusted in the laboratory by programming the parameters in the electric power meter. In this case, the monitoring of the performance of the current transformers and of the eventual failures and unbalancing is still not carried out in real time.

Based on the above, it is concluded that in the current technique there are no devices or processes used in the transformer itself that are suitable for the current and potential transformers that allow information related to its internal performance in real time to be obtained. In addition, there are no known devices or processes applicable to current and potential transformers that perform the tasks mentioned previously and at the same time allow information related to the whole circuit to be obtained from the windings of the transformers to the very inside of the electronic or electromechanical meters, for verification, confirmation and legal proof of any irregularities or failures in the operating or billing measurement of the consumption units or substations that have this kind of equipment (indirect measurement).

According to the current state of the art, the inner software of certain electronic meters is able to identify certain events such as, for example, the current circuit reversal, absence of voltage in the potential circuit, opening the meter cover. Yet these resources have limited application, and are not sufficient to prove deviation, adulteration or any failures in the current and potential circuits of the indirect measurement associated to the respective instrument transformers. They also do not permit the immediate verification whether the reduction in consumption was real or the result of a fraud used to cause underbilling of the power consumption.

OBJECTIVES OF THE INVENTION

A first objective of the invention is to provide a self-monitoring system for current and potential transformers and measurement of associated electric power, having low cost, high reliability and that can be installed both as an integral part of the power utility's operating and billing measurement system, in addition to periodic or permanent checks and inspections.

Another objective of the invention is to provide a self-monitoring system for current and potential transformers and measurement of associated electric power that is inviolable (encapsulated electronic measurement with the current and/or potential transformer), having suitable precision, without any alteration or installation difficulty, and that allows constant and continuous self-monitoring of any failures or irregularities that may appear in the current and/or potential circuit of the operating or billing measurement.

It is also an objective of the invention to provide a self-monitoring system for current and potential transformers and measurement of associated electric power capable of proving any stratagems employed to cause underbilling of the electric power consumed, because it keeps a permanent and inviolable record of the integration of the current and voltage over time.

It is an objective of the present invention to allow the appraisal of the operating performance of the current and potential transformers in the field, facilitating eventual diagnoses.

Another objective of the invention is to provide a method of monitoring and diagnosing transformers in a power measurement installation in a distribution and/or transmission electric power network which, based on the results measured from certain electrical quantities, generate diagnoses based on the results of the comparisons.

BRIEF DESCRIPTION OF THE INVENTION

The objectives of the invention are achieved by means of an individualized self-monitoring system for transformers in an electric power measurement installation in a distribution and/or transmission electric power network to measure the electric power at a distribution point and/or electric power transmission, which comprises:

at least a transformer connected to the electric power distribution and/or transmission point; and at least a time-integrated electrical quantity meter, directly coupled to one of the windings of at least a transformer, the meter being capable of measuring and recording the electrical quantity of said winding.

The system comprises alternatively at least a current transformer and at least a time-integrated electric current meter, and each of the Ah meters is connected to just one winding of the current transformer, and/or also comprises at least a potential transformer and a time-integrated electric voltage meter (Vh) coupled to its secondary winding. Further, the system may comprise an external measurement unit coupled to the power input of a power receiving point being powered by said electric power distribution and/or transmission point, and the external measurement unit measures at least an electrical power quantity delivered at the power input of the power receiving point.

The external measurement unit may comprise an integrated quantity meter coupled to its base. The receiving point can be a consumption unit, defined as a set of electrical installations and equipment characterized by the reception of electric power at a delivery point or a substation.

The external measurement unit can be in the form of an electro-electronic power meter. These electro-electronic meters are present in the vast majority of consumption units or in indirect measurement substations.

The time-integrated electrical quantity meter may be an Ampere-hour (Ah) or Volt-hour (Vh) meter.

The Ampere-hour meter can be located in the primary and/or secondary winding of any kind of current transformer for measurement, installed at consumption units and/or substations, at any voltage level. The combination of a current transformer and at least an Ah meter is defined as a self-monitoring current transformation unit (UAMTC).

The Volt-hour (Vh) meter can be coupled to the secondary winding of any kind of potential transformer for installed measurement in consumption units and/or substations, at any voltage level. The combination of a potential transformer and a Vh meter is defined as a self-monitoring potential transformation unit (UAMTP).

The meters of a certain electrical quantity may be an integral part of the body or single part of the transformer of the same electrical quantity previously manufactured for this purpose or may be coupled to the transformer of the same already existing quantity, including the functions of measurement, recording and the possibility of storage in storage memory and transmission or transfer of the measured values to external displays or units/reading and collection centers, local or remote of these data.

The self-monitoring system may also comprise a Remote Communications Module (RCM), connected to the output of at least an electrical quantity meter to transmit the time-integrated electrical measured values quantity to a tele-measurement station. The system may also comprise a Record and Communication Unit (RCU) that receives and stores measurement information, by a wireless data communication channel, from the Remote Communications Module, and is capable of transmitting this measurement information to the tele-measurement station. A Record and Communication Unit can also receive and store measurement information from the external measurement unit. Record and Communication Unit is capable of transmitting the data received and stored to one among a tele-measurement station, an Information Reader/Collector Device and an external measurement unit.

Preferably, at least a meter and the transformers are encapsulated in the same casing. Further, the Remote Communications Module (RCM) is assembled in said casing, together with the transformers and the meters.

The Record and Communication Unit may also comprise a storage memory where the quantity measured values are stored and a display shows the values of the electrical quantities measured by at least a meter.

The self-monitoring system may also comprise a hand held Information Reader/Collector Device that receives and stores measurement information from at least one among the Remote Communications Module, the Record and Communication Unit, the external measurement unit, the time-integrated electric current meters Ah and the time-integrated electric voltage meter Vh. The Information Reader/Collector Device should also be capable of transmitting the data received and stored to at least one among a tele-measurement station, an external measurement unit and the Record and Communication Unit.

The self-monitoring system may also comprise a display capable of displaying the values of the electrical quantities measured by at least a meter and a current transformation ratio at a certain time interval.

The self-monitoring current transformation unit (UAMTC) and the self-monitoring potential transformation unit (UAMTP) can be installed in the consumption unit or substation, in the cubicle or measurement panel, as specific equipment of the operating or billing measurement system or with the purpose of checking and inspecting, installed in the input branch, outside the consumption unit or substation.

In the self-monitoring system according to the invention, at least one among the Information Reader/Collector Device LCI, the Record and Communication Unit RCU and the external measurement unit can automatically perform a comparison and diagnosis function, being capable of processing the data of at least one among the time-integrated electrical quantity meters, Ah and/or Vh, and the external measurement unit, and of comparing the data received and issuing diagnoses based on the results of the comparisons. This function may also be performed by an operator, either locally or remotely.

In an alternative embodiment, the self-monitoring system also comprises an electronic module whose inputs are the current signals coming from the Ah electric current meters located in the primary and secondary windings of the same current transformer. The electronic module is capable of measuring the angular difference between the primary and secondary current signals.

The objectives of the invention are also achieved by means of a method of monitoring and diagnosing transformers in an electric power measurement installation arranged in a distribution and/or transmission electric power network to measure the electric power at a electric power distribution and/or transmission point, a power measurement installation comprising at least a transformer connected to the electric power distribution and/or transmission point, and at least a time-integrated electrical quantity meter, directly coupled to one of the windings of the transformer, the meter being capable of measuring and recording the electrical quantity of said winding, comprising the steps of:

measuring values of at least a time-integrated electrical quantity directly in at least a winding of at least a transformer;

performing comparisons between the values measured;

generating results from the comparisons; and formulating a diagnosis based on the results of the comparisons.

The step of measuring includes at least the following readings: measuring an electric current in the primary winding of at least an electric current transformer; measuring an electric current in the secondary winding in at least an electric current transformer; measuring an electrical voltage in the secondary winding of at least a potential transformer and measuring with an external electric power measurement unit at a power receiving point that receives power from a power delivery point in which the measurement installation is connected.

The step of performing comparisons includes at least the following comparisons: comparing measurements from different windings of a same transformer; comparing the reading obtained directly from a time-integrated electrical quantity of the secondary winding of a transformer with the reading obtained from the same electrical quantity in an external measurement unit; comparing these values related to the time-integrated electric currents in one of the windings of at least two current transformers and comparing these values related to time-integrated electric voltages in the secondary winding of at least two potential transformers.

The steps of performing comparisons between the measured values; generating results from the comparisons; and formulating a diagnosis based on the results of the comparisons can be performed automatically by a circuitry connected to the power measurement installation, or manually by one among an operator situated at the power measurement site and an operator situated at a remote site from the power measurement site.

The step of performing the diagnosis is based on analysis of the results of the comparisons made, the main diagnoses formulated being: identifying the opening of any phase through the disconnection of the connection conductor of the secondary winding of the potential transformer to the external measurement unit or in the external measurement unit itself when the Vh value corresponding to that phase in the external measurement unit is lower than the Vh value in the potential transformer corresponding to that specific phase; identifying the momentary or permanent reduction in the value of the voltage of any of the phases when the Vh value corresponding to that phase in the external measurement unit is lower than the Vh value in the potential transformer corresponding to that specific phase; identifying failures in the current transformer if the Ah value of the primary of the current transformer differs from the Ah value of the secondary of the same current transformer, considering the respective current transformation ratio; identifying diversions of electric power by bypass of secondary conductors in the cabling that leads to the external measurement unit or on the inside of the external measurement unit when the Ah value of the secondary of the current transformer of a specific phase differs from the Ah value measured by the external measurement unit, related to that phase; identifying registration errors related to the current transformation ratio, if the Ah value of the primary of the current transformer differs from the Ah value referred to the primary of the external measurement unit; identifying errors in the current transformer or any failures in said equipment based on the comparison of the primary and secondary Ah quantities identifying possible voltage imbalances between phases where there are different Vh values and identifying possible current unbalances between phases where there are different Ah values; identifying the possible angular displacement between the current signal of the secondary winding and the current signal of the primary winding of a current transformer, providing information on magnetization and ferromagnetic material core conditions of the current transformer.

BRIEF DESCRIPTION OF THE DRAWINGS

The present invention will now be described in greater detail based on an example of embodiment depicted in the drawings. The figures show:

FIG. 6b—a schematic view of the circuit of a first embodiment of the plug-in type meter that measures Ampere-hour and Volt-hour, used in three-wire measurements;

FIG. 6c—a schematic view of the circuit of a second embodiment of the plug-in type meter that measures Ampere-hour and Volt-hour, used in the four-wire measurements;

FIG. 6d—a schematic view of the circuit of a third embodiment of the plug-in type meter that measures Ampere-hour, used in the three-wire measurements;

FIG. 6e—a schematic view of the circuit of a fourth embodiment of the plug-in type meter that measures Ampere-hour, used in the four-wire measurements;

FIG. 6f—a schematic view of the circuit of a fifth embodiment of the plug-in type meter that measures Volt-hour, used in the three-wire measurements;

FIG. 6g—a schematic view of the circuit of a sixth embodiment of the plug-in type meter that measures Volt-hour, used in the four-wire measurements;

DETAILED DESCRIPTION OF THE DRAWINGS

Figure 1:
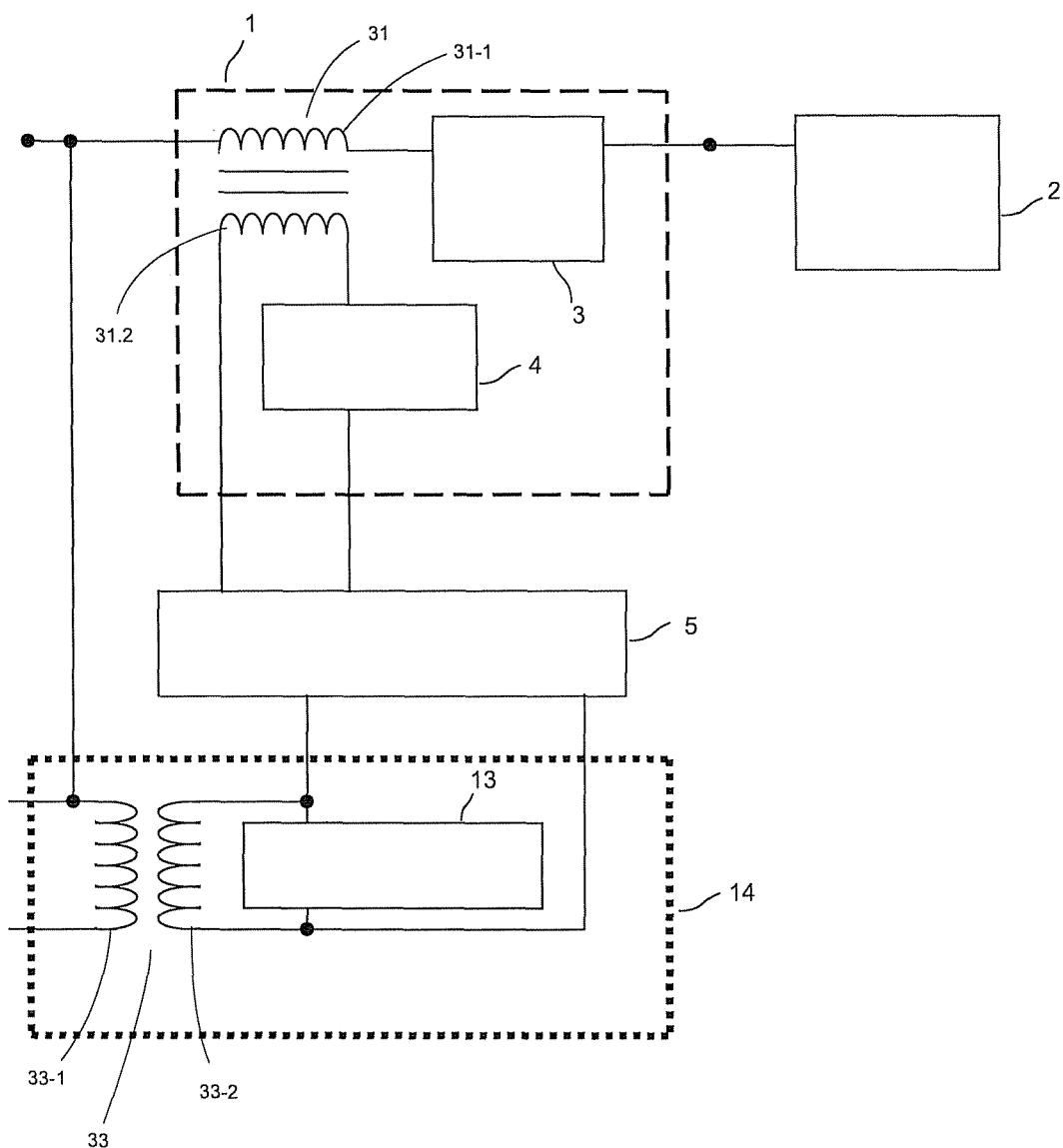
FIG. 1—a schematic diagram of a first embodiment of the individualized self-monitoring system for transformers of the present invention.

FIG. 1 depicts a first embodiment of the individualized self-monitoring system for transformers of the present invention. The self-monitoring system is applied to an electric power measurement installation in a distribution and/or transmission electric power network. Preferably, these installations include the power distribution points in order to measure the energy distributed to the consumption stations or to a distribution and/or transmission substation, including any location where the current and potential transformers can be installed in the electric system.

The system comprises at least a transformer 31, 33 used to measure the power. Preferably, the transformer is a potential transformer 33, a current transformer 31 or a combination of these transformers, which are connected to the network and/or power transmission and are normally used only for purposes of measuring electric power. However, the system may also comprise other types of transformers, or more than one potential and current transformer simultaneously, for example, connected to different power phases that are being distributed.

A time-integrated electrical quantity meter is directly coupled to one of the windings of the transformer. This meter must be capable of measuring and recording the electrical quantity of said winding. As can be seen in FIG. 1, in a preferred embodiment of the invention, a time-integrated current meter (Ampere-hour) Ah 3 is connected in series with the primary winding 31_1 of the current transformer 31, which transports an electric current to a consumption unit or a substation 2. Another current meter Ah 4 is connected in series with the secondary winding 31_2 of the current transformer 31. On the other hand, in the potential transformer 33, the time-integrated voltage meter (Volt-hour) Vh 13 is connected in parallel with the secondary winding 33_2. The Vh voltage and Ah current meters must be capable of measuring the integrated voltage (Volt-hour) and/or the integrated current (Ampere-hour) originated in the high, medium and low voltage circuitry, and recording the measured data. Preferably, the meters should have a storage memory, where all the measured data during the course of a pre-defined time-interval are stored. This resource is responsible for assuring that the system is inviolable, since even if other external power measurement devices normally used at consumption points or substation are damaged, the time-integrated quantity data will remain stored in the Ah and Vh meters. To measure Vh and Ah, analog thyristor circuits can be used, with provision for use in a digital system, or another kind of circuit capable of measuring time-integrated voltage and/or current.

As can be seen in FIG. 1, according to this embodiment of the invention, the Ah current meters and the Vh voltage meter are respectively encapsulated in the same casing of the current transformer and the potential transformer, thereafter identified respectively as UTC, 1 and UTP, 14.

The Ah current and Vh voltage meters can be integral parts of the body of the transformer, or single parts, or simply connected nearby the windings of the transformers, in such a way that there is no possibility of having diversion or significant loss of power between the transformers and the respective meters.

In this embodiment of the invention illustrated in FIG. 1, the secondary winding 31_2 of the current transformer 31 and of the potential transformer 33 are connected to an external measurement unit 5, which receives the current from the current transformer 31 and the voltage from the potential transformer 33. An electronic meter or an electromechanical power meter can be used as external measurement unit 5. The electronic meters are already present in most of the consumption units and substations with indirect measurement. These meters have internal records of the electrical quantities being measured. Optionally, it is also possible to use Ah and Vh meters 19 fitted jointly to the base 5b of the electromechanical meters or electronic meters without the Vh and Ah function, for example, by way of the plug-in's shown in FIGS. 6a, 6b, 6c, 6d, 6e, 6f and 6g.

The Ah current and Vh voltage meters, in a preferred arrangement, include the functions of measuring, recording, storing in storage memory and transmitting or transferring the respective electrical quantity measured values to external displays, or reading and collection units/offices, local or remote from these data.

Preferably, the system according to the present invention also comprises a unit that performs the comparison and diagnosis functions, which can be the Information Reader/Collector Device LCI 9, the Record and Communication Unit RCU 7 and/or an external measurement unit 5, which will be described in greater detail further ahead. To perform the comparison and diagnosis functions, this(these) unit(s) must receive the measured data obtained by at least some of the electrical quantity meters, and be capable of comparing the data received, produce comparisons from these results and issue diagnoses based on the results of the comparisons.

For example, in the embodiment of the invention in which the external measurement unit 5 will perform the comparison and diagnosis functions, it should also receive the measured data from the Ah and Vh meters, either by direct connection, by a Remote Communications Module of the kind described ahead, or by a Record and Communication Unit, or Information Reader/Collector Device 9.

However, carrying out the comparison and diagnosis functions by means of one of these units is not essential to the system of the present invention, since these functions can be performed manually or visually by an operator or technician, who can visualize the voltage and current measured data, make comparisons between the measured data, produce results from these comparisons and issue diagnoses based on the results of the comparisons. This operation can be performed by the local operator or remotely.

Figure 2:
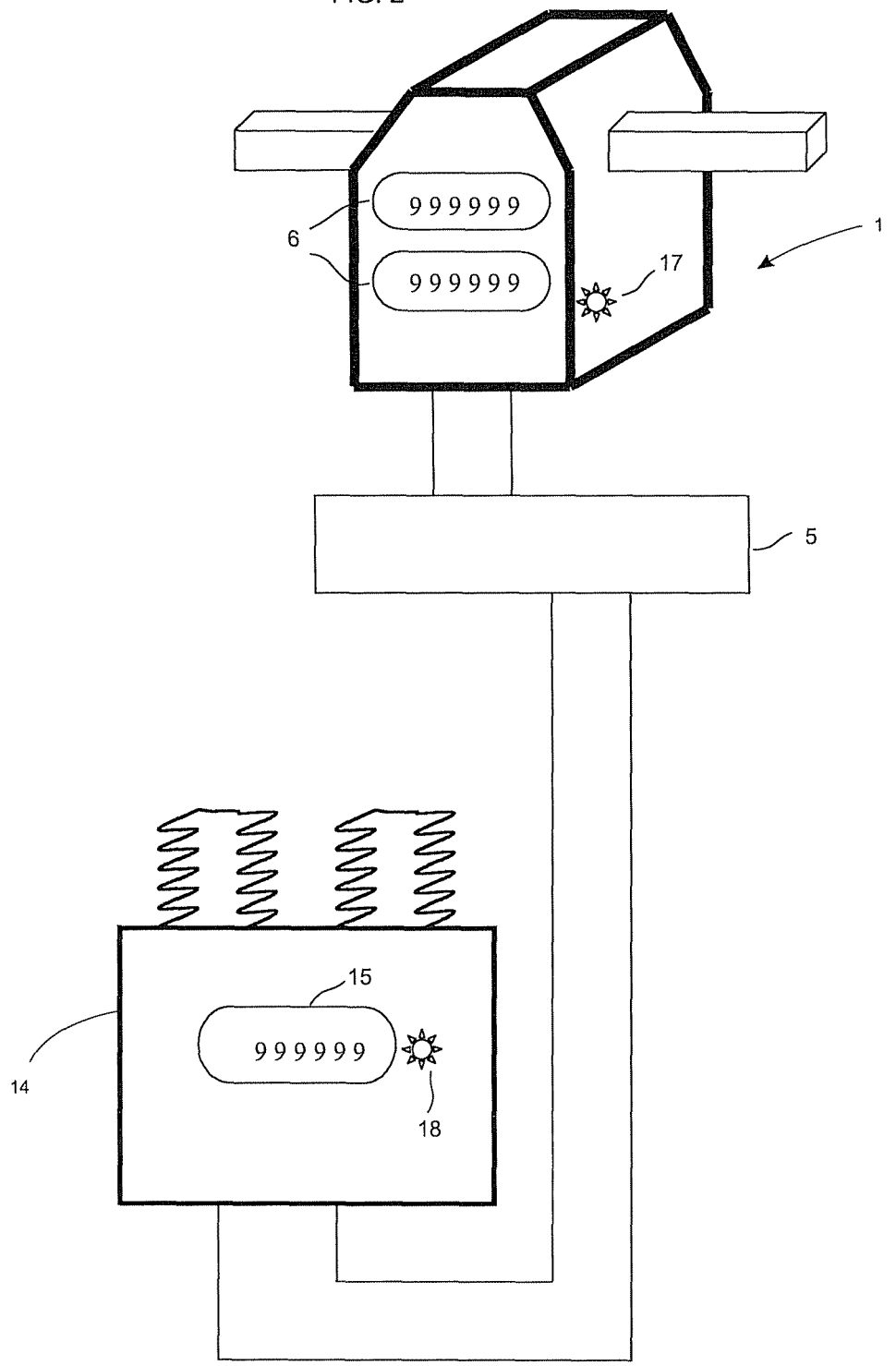
FIG. 2—a perspective view of a constructive implementation of the first embodiment of the system according to the invention including a current transformer and a potential transformer.

FIG. 2 depicts a perspective view of an embodiment of the system according to the invention illustrated in FIG. 1, wherein the Ah meters and Vh meter are built-in respectively in the same casing of the current and potential transformers.

In FIG. 2, the self-monitoring current transformation unit has two Ah meters encapsulated inside its casing. The Ah meters transmit to external displays 6 the values of the time-integrated electric currents from the primary and secondary windings of the current transformer.

In a preferred arrangement, it is possible to use one or two displays, which can also present a real current transformation ratio, or indicate when a difference above a certain value in said ratio occurs.

In the same figure a possible constructive implementation of a self-monitoring potential transformation unit UAMTP 14 is introduced, with a Vh voltage meter encapsulated inside the case of the unit and connected to the secondary winding of the transformer. The Vh meter transmits the secondary winding time-integrated electrical voltage value to a display 15.

As can be seen in FIG. 2, the system may also comprise output devices for calibration, one for quantity Ah 17 and another for quantity Vh 18, as well as an external measurement unit 5 of electric power, herein also referred to as electronic meter.

Figure 3:
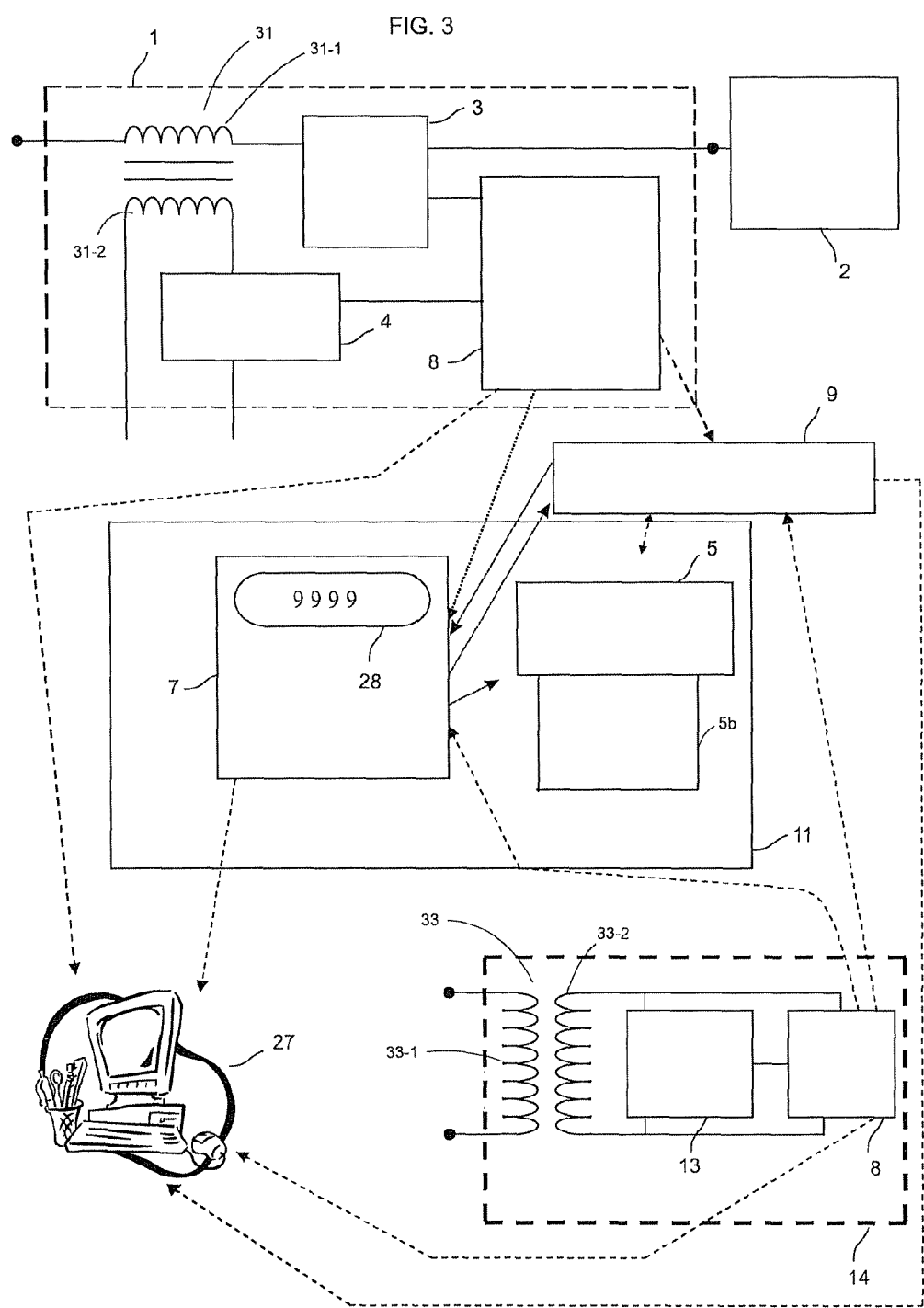
FIG. 3—a schematic diagram of second embodiment of the system of the present invention, in which the Ampere-hour values measured from the current transformer and the Volt-hour values measured from potential transformer are sent to remote units.

FIG. 3 presents a schematic view of a second embodiment of the system in which the Ah and Vh values measured from the current and potential transformers are sent to remote units, providing additional means for direct reading of the displays of UTC 1 and UTP 14.

One of the remote units is the Record and Communication Unit-RCU 7, the purpose of which is to be an additional option for automatically obtaining the data measured both from the time-integrated current by the Ah meter(s) 3, 4, and from the time-integrated electrical voltage, by the Vh meter 13. For example, when a difficulty arises in reading the displays incorporated into the self-monitoring current transformation units 1 or in the self-monitoring potential transformation units 14.

For this purpose, the Record and Communication Unit RCU 7 may be placed in a measurement cubicle 11, near the external measurement unit 5. The Record and Communication Unit RCU 7 can also transmit the values to a tele-measurement center 27 of the utility or substation. This is only necessary if it is desirable to obtain the information in a quicker manner, such as in real time. The RCU 7 can also transmit data to an Information Reader/Collector Device 9 or to an external measurement unit 5, if one of these devices is to perform the comparison and diagnosis functions.

Optionally, the RCU 7 can collect information from the electric power meter 5 and/or from the Ah and Vh meters, which can be connected directly to the RCU 7 or be connected to transmission devices that transmit the values measured by them to the RCU 7. Additionally, the RCU 7 can also perform the comparison and diagnosis function, comparing the measured values, generating results from the comparisons and formulating diagnoses based on the Ampere-hour and Volt-hour measured values and other quantities measured by the system.

The Record and Communication Unit 7 basically comprises an input and output interface, a controller with a simple memory and/or storage memory and a power source.

As can be seen in FIG. 3, the system may also comprise a second remote unit referred to as Remote Communications Module RCM 8, which transmits the time-integrated current or voltage data, both to the RCU 7 and to a remote data collection device and an Information Reader/Collector Device LCI 9 which is a hand held device for remote and automatically collectioning data.

The Remote Communications Module 8 basically comprises an inner input interface, a memory controller, an output interface and, when using the UTC 1, preferably, a power source that does not have a battery, the power coming from the consumer's installation itself.

The LCI 9 can optionally collect information from the electric power meter 5 and from the Ah and Vh meters, which are connected to the LCI and send the values measured thereto. Additionally, the LCI can carry out comparison and diagnosis functions, compare the measured data, generate results from the comparisons and formulate diagnoses based on the Ampere-hour and Volt-hour measured data and other quantities measured by the system.

The Information Reader/Collector Device LCI 9 basically comprises an input and output interface, a normal or storage memory controller and a power source and can be embodied in the form of a hand held device.

In the embodiment depicted in FIG. 3, the Ah 3 and Vh 13 meters include a wireless Remote Communications Module RCM 8, encapsulated in UTC 1 or in UTP 14, which transmits the time-integrated current or voltage data to the utility, directly by tele-measurement, to a Record and Communication Unit RCU 7, and/or to the remote data collection device and an Information Reader/Collector Device LCI 9.

The Remote Communications Module 8 can use various technologies for data transmission, including: GSM (Global System for Mobile Communications), mobile technology preferably used for cellular telephony; GPRS (General Packet Radio Service) technology which increases the data transfer rate between GSM networks by way of package relay; ZIG-BEE, series of high level protocols intended for digital radio communication with low power consumption; and BLUETOOTH, industrial specification for wireless communication networks, which can be used by various devices such as laptops, palmtops, printers and digital cameras.

According to the embodiment of the invention shown in FIG. 3, the system also comprises a Record and Communication Unit RCU 7 with a respective display 28, the purpose of which is to provide an additional option of automatically obtaining the data measured both from the time-integrated current by the Ah meter 3, 4, and the time-integrated electrical voltage, by the Vh meter 13.

As shown in FIG. 3, the RCU 7 can also transmit the data received from the RCM 8 to a tele-measurement center of the utility or substation 2, which are located remotely from RCU 7.

Pursuant to the embodiment depicted in FIG. 3, the Remote Communications Module 8 can be installed in the following positions:

(a) in the self-monitoring current transformation unit 1, which receives the information from the primary 3 and/or secondary 4 Ampere-hour meter through an inner input interface; and/or (b) in the self-monitoring potential transformation unit 14 which receives the information from the Vh meter 13 through an inner input interface.

Figure 4:
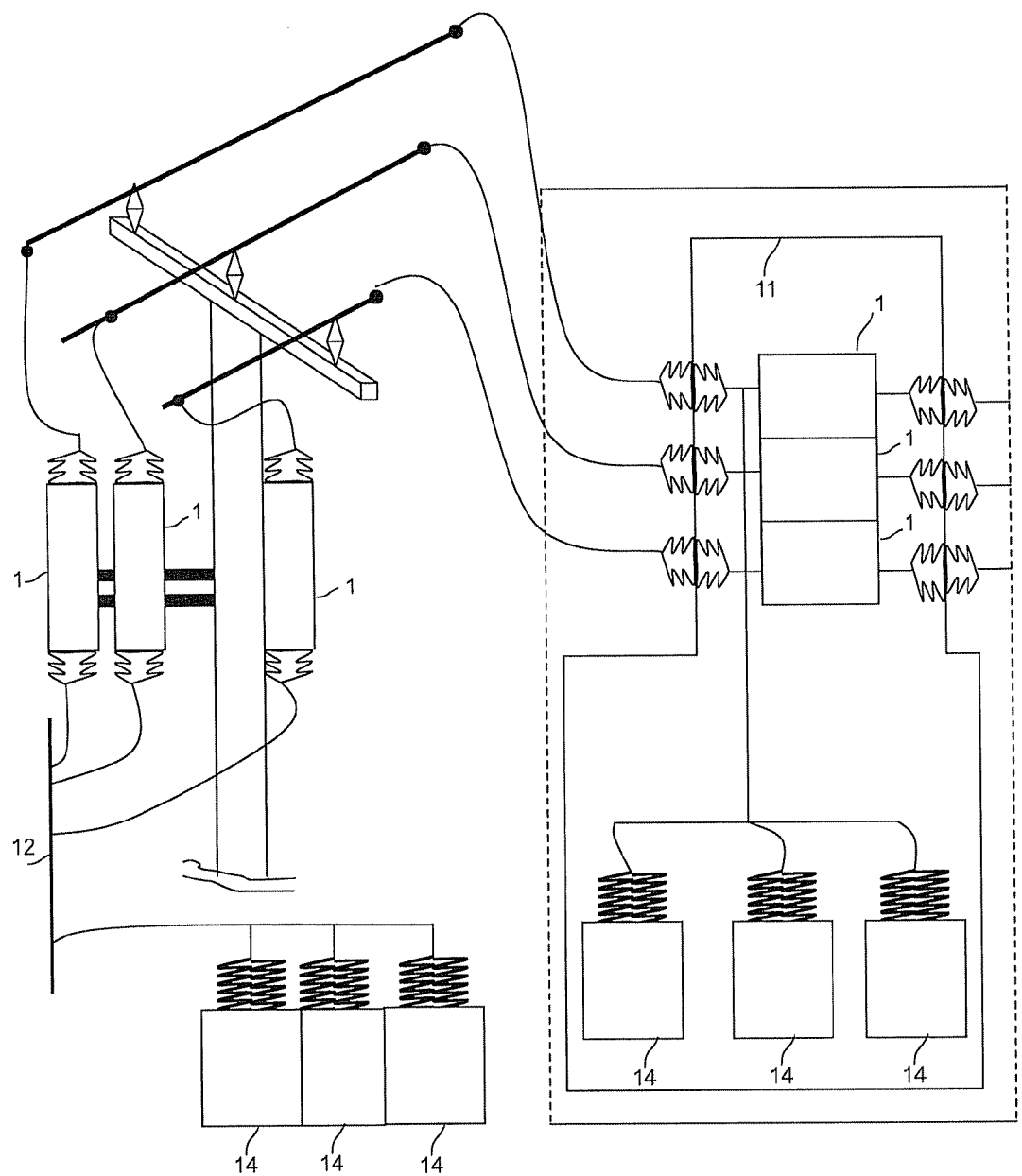
FIG. 4—a schematic view of a third embodiment of the system according to the invention, including various current and potential transformers, in an electric power measurement installation of an electric power network system.

FIG. 4 presents a schematic view of a third embodiment of the system including various current and potential transformers and installed in an electric power measurement installation of a power network system. In this embodiment of the invention, it is possible to have a UTC 1 for measuring each phase in a three-phase network.

FIG. 4 presents a general view of an installation of the system according to the invention, in which the UTC's 1 and the UTP's 14 are connected, for example, in a distribution network of the utility 12, either in the situation of inspection/ checking, outside the consumption unit, or for the operational measurement system or billing system per se, inside the consumption unit or substation, in the measurement cubicle 11.

It is important to clarify that other assemblies can be carried out in transmission systems or in specific substations, having different topologies.

Figure 5:
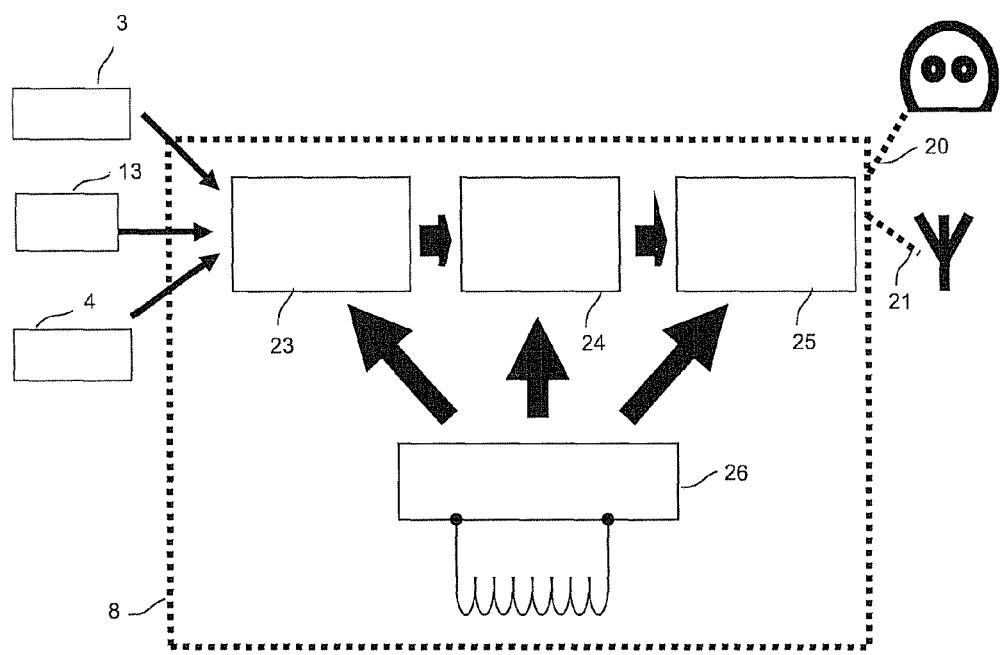
FIG. 5—a schematic diagram of a preferred embodiment of a remote communication module applied to the system of the present invention.

FIG. 5 presents a schematic diagram of a preferred embodiment of a Remote Communications Module 8.

As described previously, the Remote Communications Module 8 basically comprises an inner input interface 23, a memory controller 24, an output interface 25 and, in the case of using a UTC, a power source 26.

In this embodiment, the information received in the inner input interface 23 by at least one of the electrical quantity meters, primary Ah 3, secondary Ah 4 and/or secondary Vh 13, are forwarded to a memory controller which relays them to an output interface 25, which can be optical 20 or by radio waves 21.

It is important to highlight that in the case of the self-monitoring current transformation unit 1, the system has a power source 26 that has no battery, the power being provided by the load circuit current itself. When this is not possible and there is a need to read the present value in the memory, it is possible to energize the device by electromagnetic induction, similar to the energization used for magnetic cards with chips. A high frequency source induces radio frequency waves, captured by a special coil from the remote communication module source and this energy is used to power the instrument, even in the absence of a load circuit current.

For the self-monitoring potential transformation unit 14, the source of voltage is already present in the secondary of the potential transformer.

The electric power meters in the system may present a plug-in type connection if the electronic meter does not have the capacity to measure and record the Ah or Vh quantities or if the meter is based on the electro-mechanical induction principle. FIGS. 6a to 6g illustrate various possible forms of embodiment of plug-in type connections that can be used by the system of the present invention.

Figure 6A:
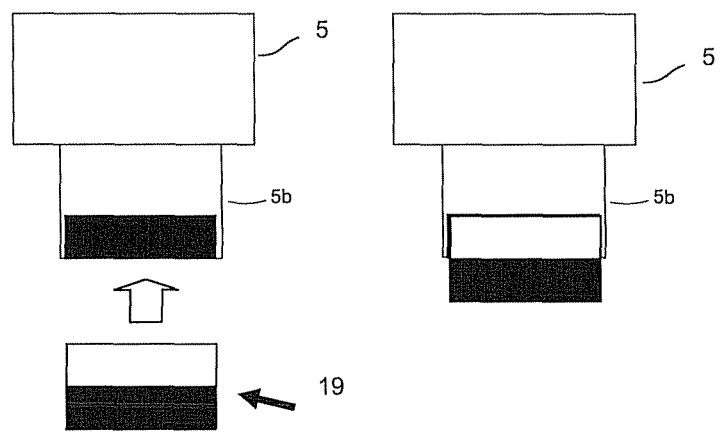
FIG. 6a—a schematic view of a measurement circuit applied to an embodiment of the present invention, using a plug-in type meter.

FIG. 6a presents an example of a preferred solution with a plug-in type connection, of the Ah and/or Vh meters, connecting the meters 19 to the terminals block 5b of the electric power meter. This solution can be used in electric power distribution systems with any kind of topology, such as, for example, delta, star (wye), grounded, as detailed in FIGS. 6b, 6c 6d, 6e, 6f and 6g.

Figure 6B:
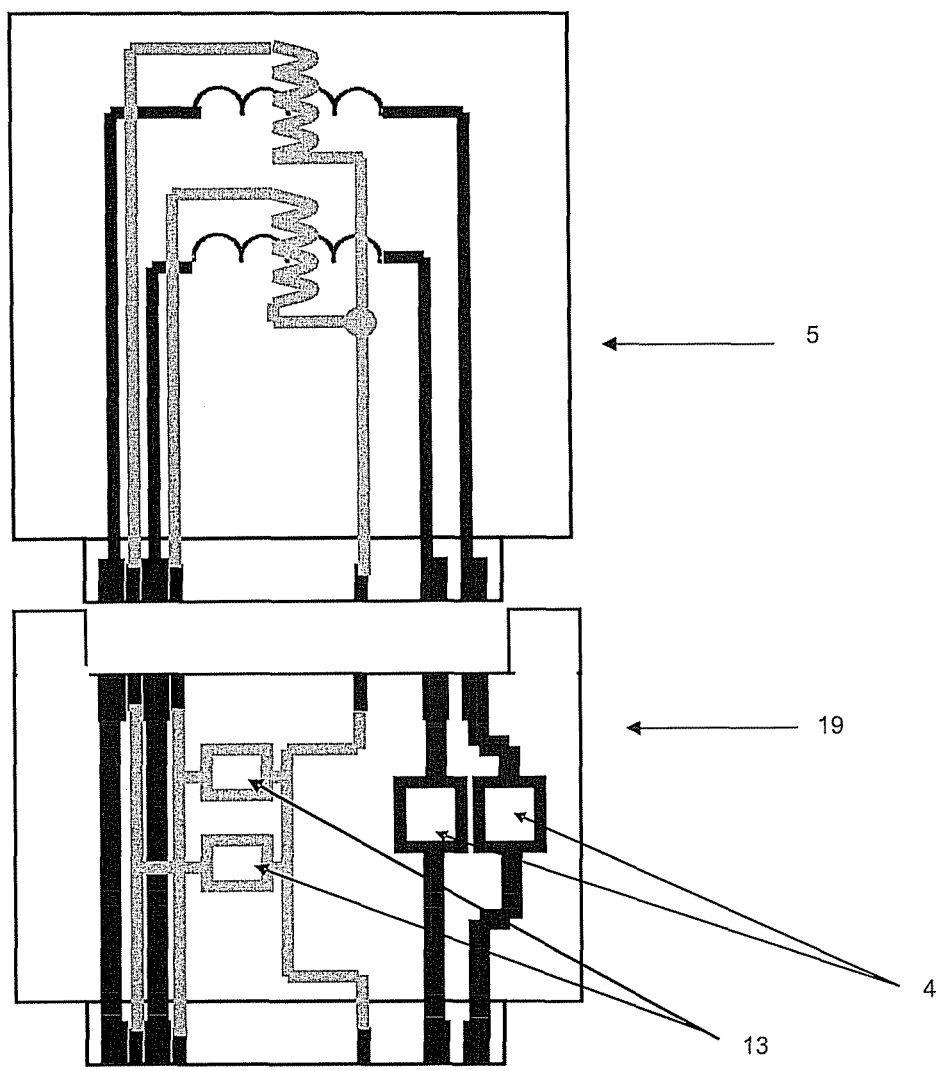

FIG. 6b presents a schematic view of the circuit of a first embodiment of the plug-in type meter that measures Ampere-hour and Volt-hour, used for three-wire measurement.

Figure 6C:
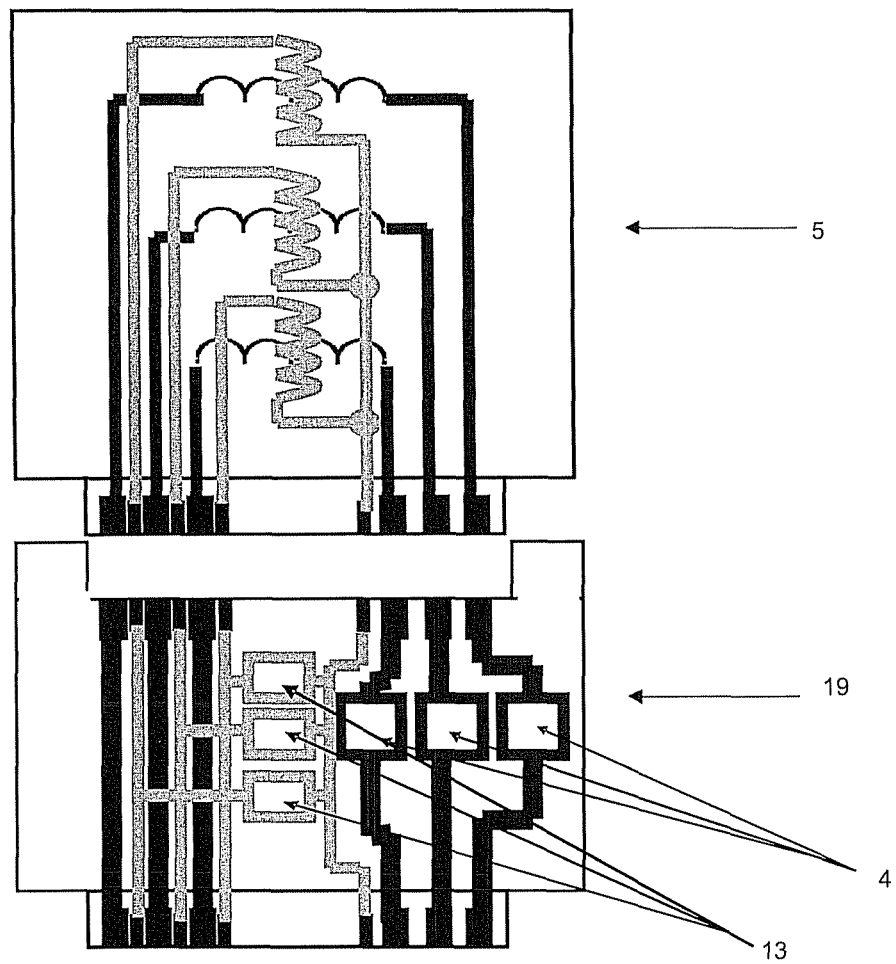

FIG. 6c presents a schematic view of the circuit of a second embodiment of the plug-in type meter that measures Ampere-hour and Volt-hour for four-wire measurement.

Figure 6D:
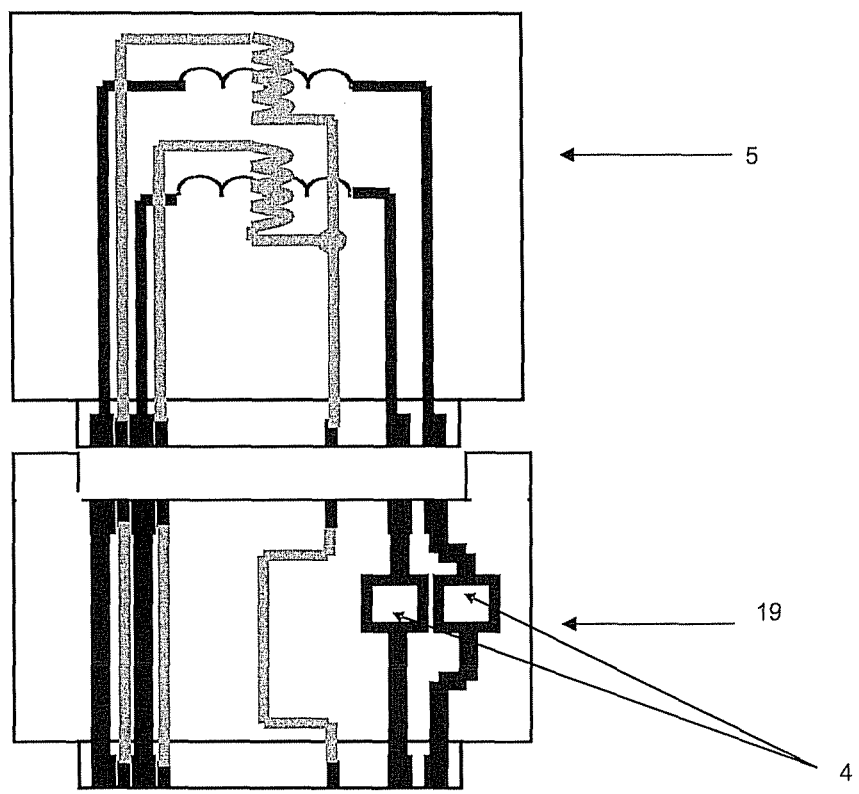

FIG. 6d presents a schematic view of the circuit of a third embodiment of the plug-in type meter that measures Ampere-hour for three-wire measurement.

Figure 6E:
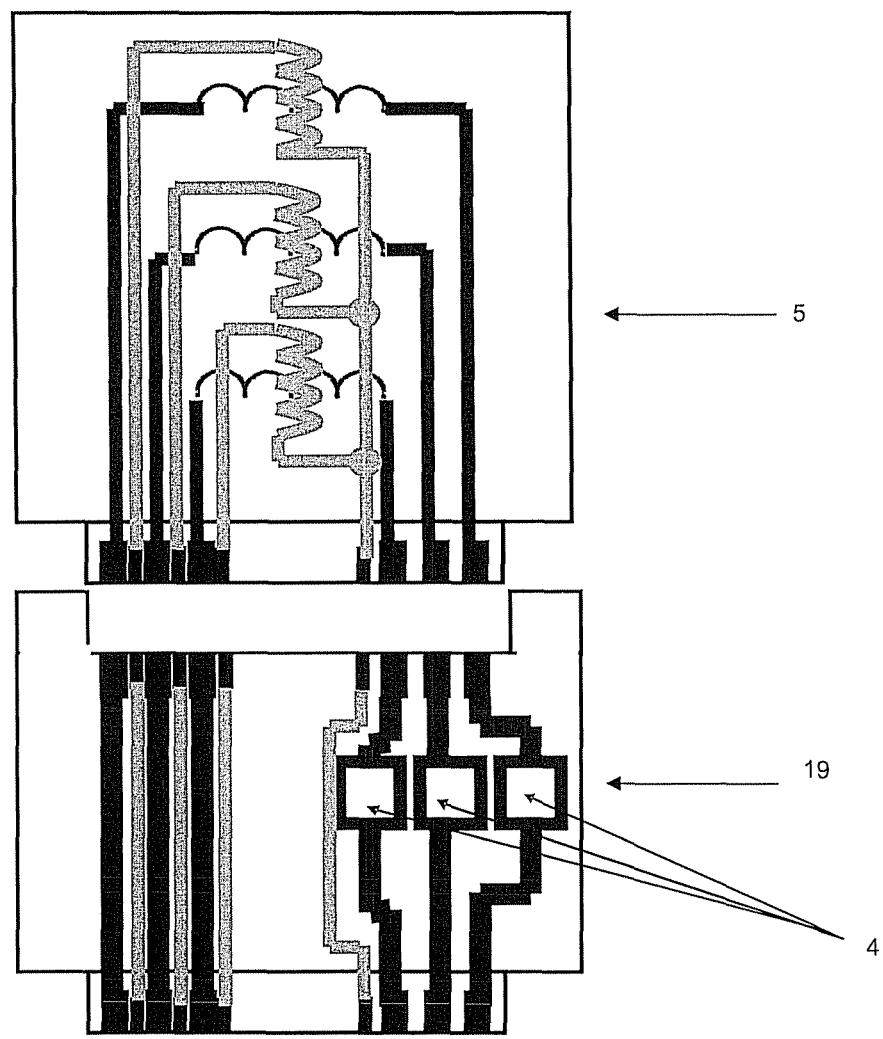

FIG. 6e depicts a schematic view of the circuit of a fourth embodiment of the plug-in type meter that measures Ampere-hour for four-wire measurement.

Figure 6F:
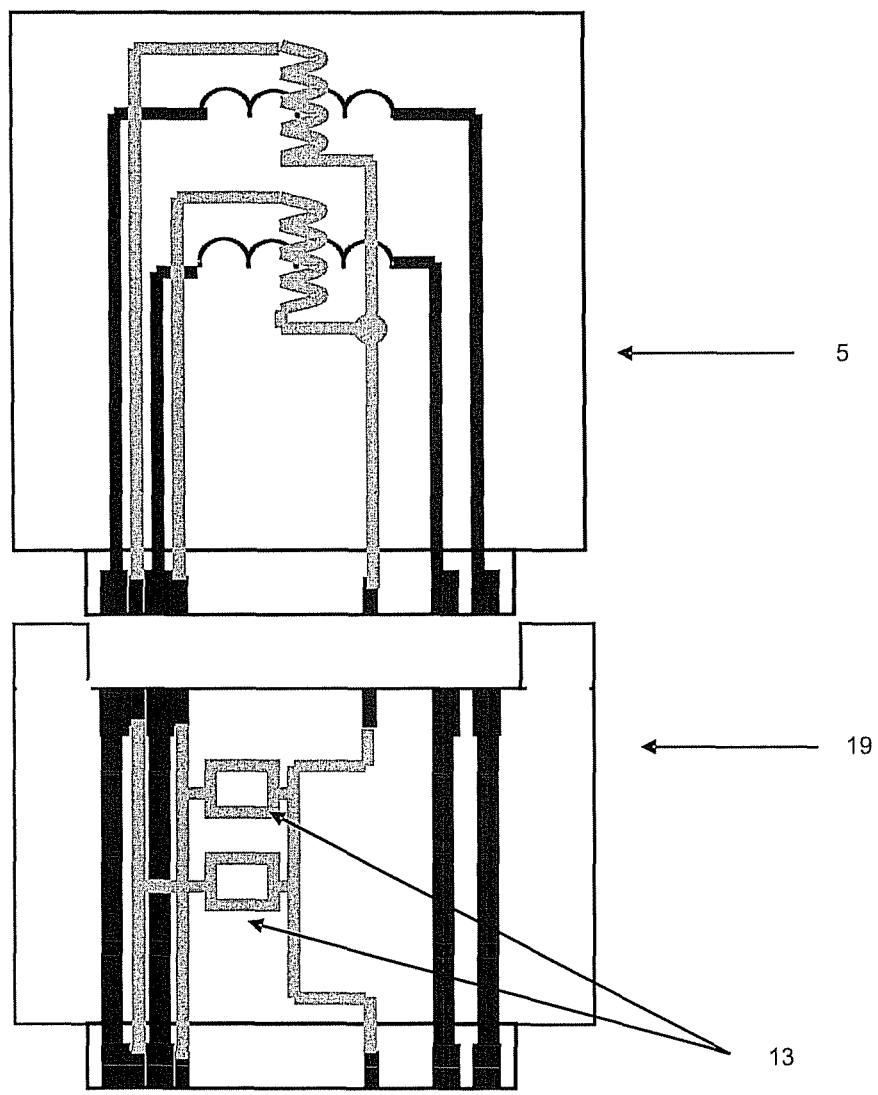

FIG. 6f depicts a schematic view of the circuit of a fifth embodiment of the plug-in type meter that measures Volt-hour for three-wire measurement.

Figure 6G:
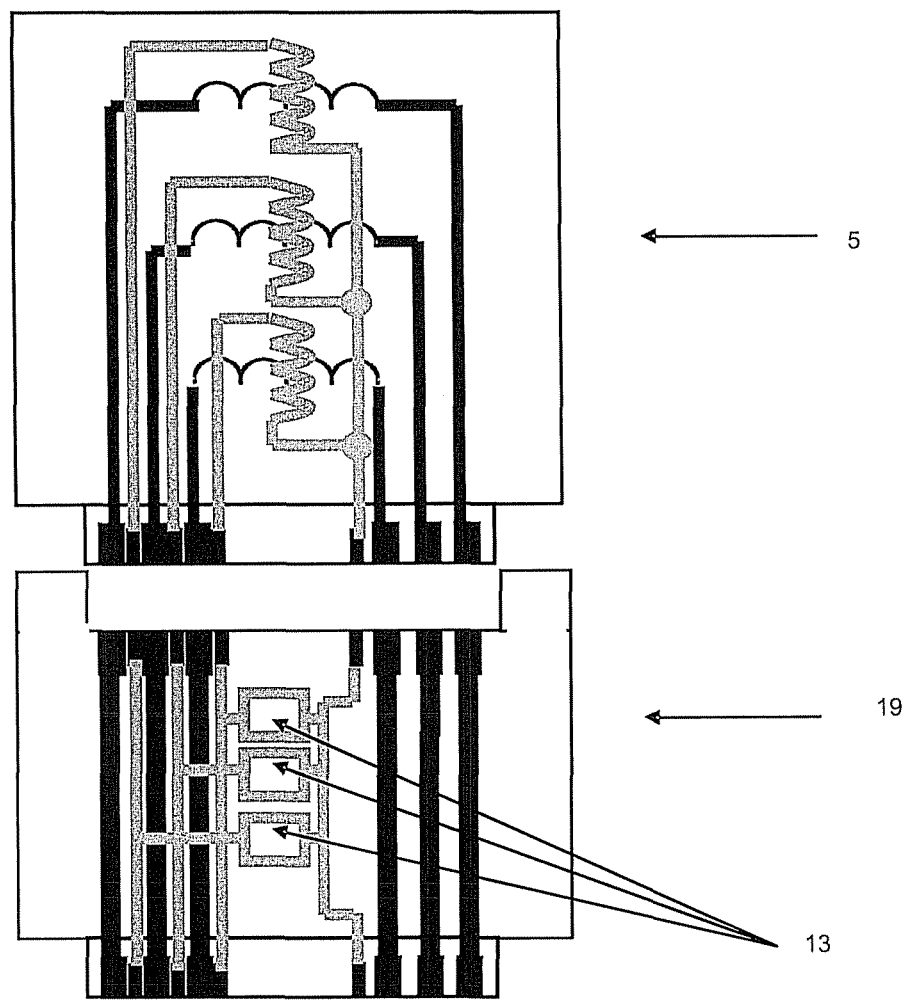

FIG. 6g depicts a schematic view of the circuit of a sixth embodiment of the plug-in type meter that measures Volt-hour for four-wire measurement.

Figure 7:
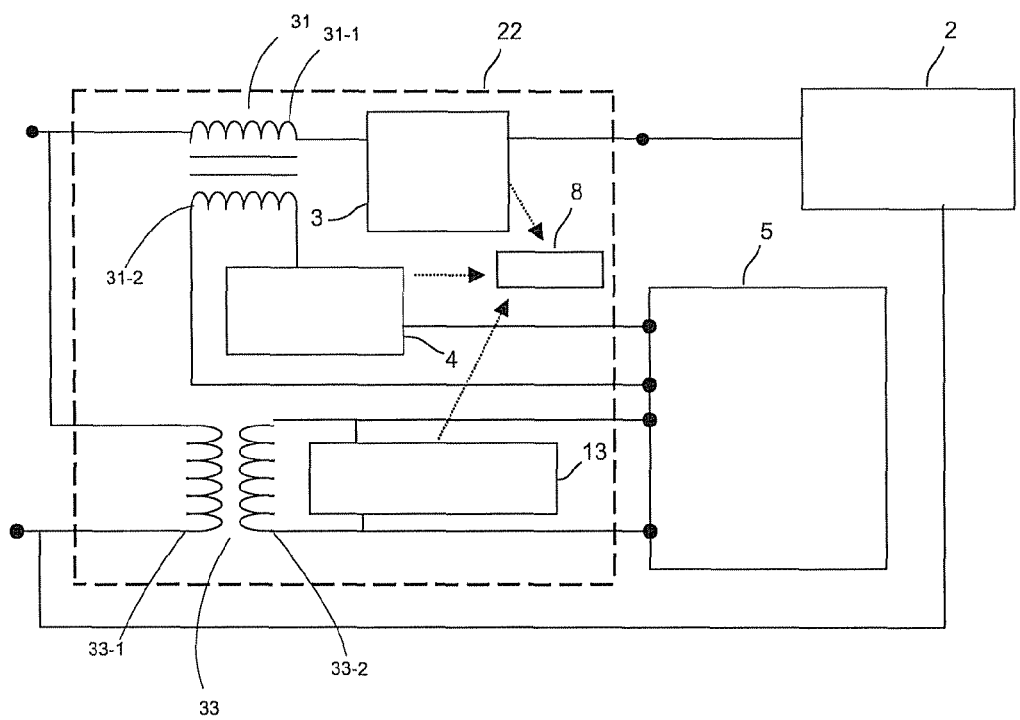
FIG. 7—a schematic view of a fourth embodiment of the system according to the invention, wherein the transformers and the current and voltage meters are encapsulated together.

FIG. 7 depicts a schematic view of a fourth embodiment of the system in which the current transformer 31, the primary Ampere-hour meter 3, the secondary Ampere-hour meter 4, the potential transformer 33 and the Volt-hour meter 13 are encapsulated together, in the same casing 22. Additionally, the Communication and Record Module 8 may be encapsulated in the casing 22, together with at least a current transformer 31, and/or potential transformer 33, further to at least a meter 3, 4, 13.

The Ah 3, 4 and Vh 13 meters encapsulated together can send information from the respective electrical quantities to the Communication and Record Module 8. The self-monitoring potential transformation unit and the self-monitoring current transformation unit which are encapsulated in the same casing 22 are connected to an electronic electric power meter 5 by the secondary winding 33_2 of the potential transformer 33 and secondary winding 31_2 of the current transformer 31. A consumption unit 2 is connected outside said casing 22.

Figure 8:
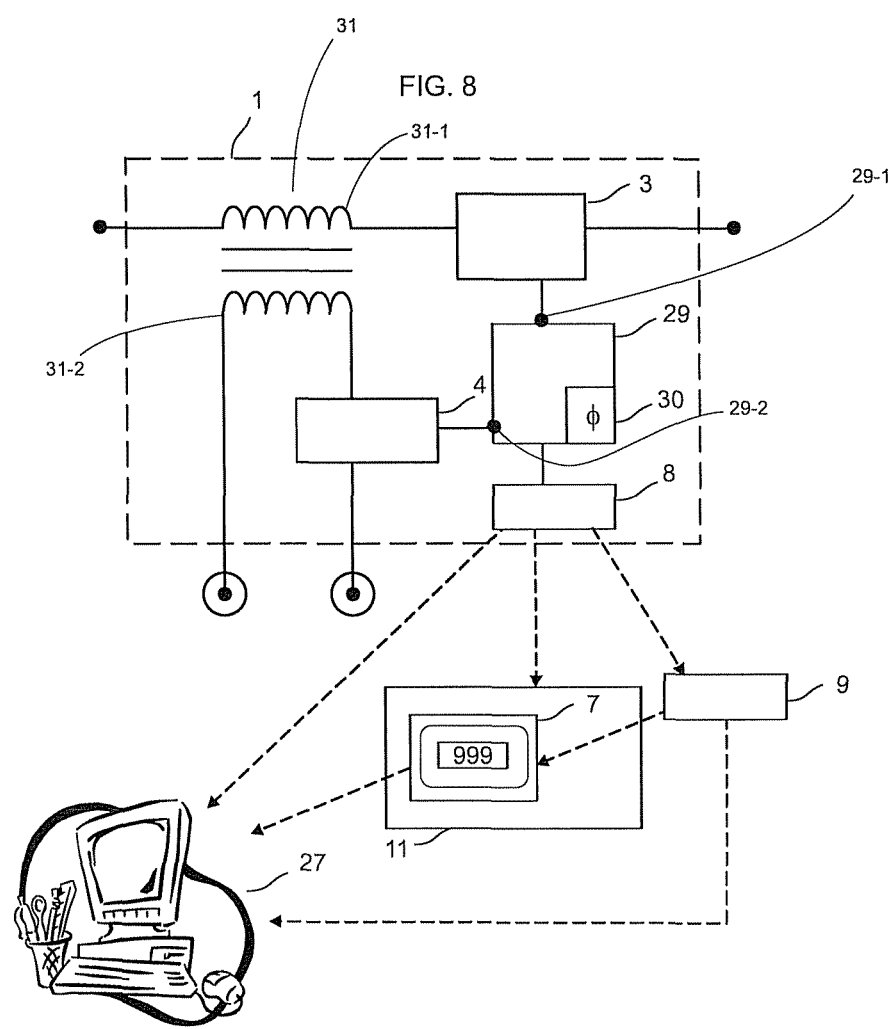
FIG. 8—a schematic diagram of a fifth embodiment of the system of the present invention, which comprises an electronic module that calculates the angular displacement between a current signal measured in the secondary winding and another current signal measured in the primary winding of a current transformer.

FIG. 8 depicts a schematic view of a fifth embodiment of the system, including the self-monitoring current transformation unit 1 which comprises a current meter (Ampere-hour) Ah 3 connected in series with the primary winding 31_1 of a current transformer 31 and another Ah current meter 4 connected in series with the secondary winding 31_2 of this current transformer 31.

As can be seen in FIG. 8, the current coming from the Ah electric current meters 3, 4, encapsulated in the self-monitoring current transformation unit 1, are transmitted to an electronic module 29. The electronic module 29 has the functions of measuring, recording, storing and transmitting, the latter function by means of the module RCM 8, the data related to the angular displacement between the primary and secondary current.

The electronic module 29 may alternatively comprise a specific display 30, or be coupled to external display 6. The electronic module then transmits the data related to the angular displacement between the two currents to the display 30 or the external display 6, which may present, at preset intervals, such as, for example, every hour, or instantaneously, the angular displacement between the two currents, the displacements being positive or negative.

Further, the display 30 may also indicate at certain time intervals, the average angular displacement, time-integrated, related to the most recent time interval considered.

Accordingly, based on the knowledge of readings recorded from the time-integrated current values (primary Ampere-hour and secondary Ampere-hour of the current transformer) and the instantaneous values of the current in each winding 31_1, 31_2 of the current transformer 31, it is possible to measure and record, over time, the angular displacement between the primary and secondary currents for different operating conditions of the current transformer 31.

Preferably, the electronic module 29 can transfer the information to the Remote Communications Module RCM 8, which, in turn, can transmit the angular displacement data to the RCU 7 and to the Information Reader/Collector Device LCI 9, or also to the tele-measurement center 27. Alternatively, the Record and Communication Unit RCU 7 can also transmit these angular displacement data to the tele-measurement center 27.

In other words, the angular displacement data calculated by the electronic module 29 can be transmitted and stored by the other units of the system according to the invention pursuant to the description in FIG. 3.

In this fifth embodiment, the primary 3 and second 4 Ah meters should preferably be manufactured such that each pair coupled to the current transformer 31 is as identical and similar as possible, thus obtaining the angular diversion between the two currents with greater precision.

According to the invention, the angular displacement measurement circuit between the primary and secondary windings can be applied to more than one current transformer of a same electric power measurement installation. Therefore, the angular displacements of the primary and the secondary windings of each transformer can be compared between each other.

The present invention also presents a method of monitoring and diagnosing transformers in a power measurement installation in a distribution and/or transmission electric power network, including any location of the electric network where the current and potential transformers can be installed, been able of diagnosing the system, as described in greater detail ahead. A power measurement installation comprises at least a transformer and at least a time-integrated electrical quantity meter, directly coupled to one of the windings of the transformer, the meter being capable of measuring and recording the electrical quantity of said winding.

The method comprises the steps of measuring values of a time-integrated electrical quantity directly in at least a winding of at least a transformer; performing comparisons between measured values; and generating results from the comparisons. The method may also comprise a step of generating diagnoses based on the results of the comparisons.

The step of measuring values of a time-integrated electrical quantity directly in at least a winding of at least a transformer may comprise the following measurements in parallel or separately:
  measuring time-integrated electric current (Ampere-hour or Ah) in the primary winding of at least an electric current transformer;
  measuring time-integrated electric current in the secondary winding in at least an electric current transformer;
  measuring time-integrated electrical voltage (Volt-hour) in the secondary winding of at least a potential transformer.

In a preferred embodiment of the invention, these measurements are performed by means of Ah meters and Vh meters of the type described previously, and installed directly connected to the primary and/or secondary windings of current transformers and potential transformers installed in electric power distribution and/or transmission networks, to measure the electric power arriving at a certain point. Normally, these transformers are installed at electric power distribution and/or transmission points of the electric power network.

The step of measuring values of a time-integrated electrical quantity directly in at least a winding of at least a transformer may also comprise measuring time-integrated electric current and/or time-integrated electrical voltage with an external electric power measurement unit at a power receiving point, or distribution and/or power transmission substation, that receives power from a distribution point and/or transmission or delivery of energy in which the measurement installation is connected. These external measurement units, as stated previously, can be electronic or electro-mechanical meters of electric power.

The steps of performing comparisons between the measured values and generating results from the comparisons are preferably carried out automatically by means of a comparator circuit. In the system according to the present invention described herein, the steps of comparison and generation of results can be carried out by the Record and Communication Unit 7, by the Information Reader/Collector Device 9, by the external electric power measurement unit 5, or by the electronic module 29 for measuring angular displacement.

In another alternative embodiment of the present invention, the comparison step can be carried out by an operator/employee of an authorized company. In such case, the employee should visualize the integrated current and/or voltage values measured and displayed by the Ah meters and/or Vh meters and/or other electronic or electro-mechanical meters. Based on the results obtained by his own observations, the employee may deduce function diagnoses, failures, power theft, among others.

In the embodiment of the invention shown in FIG. 8, the steps of comparison between the measured values and generating results from the comparisons may include the comparison between the primary and secondary currents of a same transformer, and the calculation, in the electronic module 29 for measuring angular displacements, of the angular displacement between these primary and secondary currents.

In this same embodiment of the invention, the step of generating results from the comparisons comprises alternatively comparing together the values related to the angular displacement obtained in the electronic modules 29 of the current transformers that are installed nearby, in a same circuit or facility.

The step of diagnosis can alternatively carried out automatically and digitally, directly by means of the Record and Communication Unit 7, the Information Reader/Collector Device 9, the external electric power measurement unit 5, the electronic module 29 for measuring angular displacements, also by a tele-measurement center of the utility or substation, which are capable of interpreting the results from the comparisons and identifying the diagnosis corresponding to each result obtained.

The comparison of these electrical quantities enables various occurrences to be diagnosed. Below are the main comparative procedures that are part of the present invention:

Associated to Time-Integrated Electric Current:
  a) Comparison between the Ah values related to the time-integrated current that circulates through the primary winding of the current transformer with the Ah values related to the time-integrated current that circulates through the secondary winding.

The relationship between these values corresponds to the transformation ratio of the respective current transformer, with due regard for its class of precision.

Moreover, the comparison between the secondary and primary currents provides information on the angular displacement, obtaining the angular difference between the two current signals.

Examples of Possible Diagnoses:

Based on the Difference in Amplitude Between the Current Signals:
Identify connection errors.
Identify registration errors in the current transformation ratio.
Identify failures in the current transformer.
Identify continuous overload in the current transformer, not indicated by the external electric power measurement unit.

Based on the Angular Difference Between the Current Signals:
Identify inverted polarity of the winding.
Identify the performance of the current transformer in terms of the core magnetization conditions, resulting in "cruder" phase angle errors or signaling possible deterioration of the transformer.

b) Comparison of the Ah values related to the time-integrated current that circulates through the secondary winding of the current transformer with the respective Ah values related to the time-integrated current recorded by the external measurement unit.

Examples of Possible Diagnoses:
Identify current diversions in secondary conductors.
Identify current diversions inside the external electric power measurement units.
Identify diversions of electric power by bypassing the conductors installed before billing measurement.

c) Comparison together of the Ah values related to the time-integrated currents that circulate through the secondary or primary windings of two or three current transformers that are part of the measurement system, for the purpose of evaluating the load balance.

Examples of Possible Diagnoses:
Identify current unbalance in phases.
Identify connection errors.

d) Comparison, between each other, of the values related to the angular displacement obtained in the electronic modules of the current transformers that are installed nearby, in a same circuit or facility.

Examples of Possible Diagnoses:
Identify the origin of the problem of angular displacement, identifying, for example, whether the problem lies in the installation (inappropriate handling during maintenance) or in the equipment itself.

Associated to Time-Integrated Electrical Voltage:

a) Comparison between Vh values related to the time-integrated voltage that appears in the secondary winding of the potential transformer with the respective Vh values related to the time-integrated voltage recorded by the external measurement unit.

Examples of Possible Diagnoses:
Identify interruption or disconnection of secondary conductors.
Identify tricks (frauds) to reduce the voltage applied to the external electric power measurement unit by voltage dividers in the secondary conductors.
Identify tricks to reduce the voltage applied to the external electric power measurement unit by voltage dividers in the internal circuits of the external electric power measurement unit.

b) Comparison of the Vh values related to the time-integrated voltages appearing in the windings of the secondary of the two or three potential transformers that are part of the measurement system. These values should be approximately the same.

Examples of Possible Diagnoses:
Identify voltage unbalance in the phases.
Identify tricks to reduce the voltage applied to the external measurement unit by disconnection of the primary winding.

Below is a description of some of the possible diagnoses cited above, carried out based on the results of the comparisons of the values measured by the system and/or method according to the present invention:

Identify the opening of any phase by way of a disconnection of the connection conductor of the secondary winding of the potential transformer to the external measurement unit or in the external measurement unit itself, when the Vh value corresponding to that phase in the external measurement unit is lower than the Vh value in the potential transformer corresponding to that specific phase;

Identify the temporary or permanent reduction in voltage value of any of the phases, when the Vh value corresponding to that phase in the external measurement unit is lower than the Vh value in the potential transformer corresponding to that specific phase;

Identify failures in the current transformer if the Ah value of the primary of the current transformer differs from the Ah value of the secondary of the same current transformer, according to the current transformation ratio;

Identify diversions of electric power by bypassing the secondary conductors in the cabling that leads to the external measurement unit or inside the external measurement unit itself, when the Ah value of the secondary of the current transformer of a specific phase differs from the Ah value measured by the external measurement unit, related to that phase;

Identify registration errors related to the current transformation ratio if the Ah value of the primary of the current transformer differs from the Ah value said to the primary of the external power measurement;

Identify ratio error in the current transformer or any failures in said equipment, when the result of the comparison of the electric current integrated in the primary winding and in the secondary winding of the same transformer does not correspond to the known value of the transformation ratio of that current transformer;

Identify potential voltage imbalances between phases, when the Vh values measured in the voltage transformers corresponding to each phase differ from each other; and Identify potential current imbalances between phases, when the Ah values measured in the current transformers corresponding to each phase differ from each other.

Accordingly, the electric power utilities have a system that presents a solution achieved by minor economic commitment and significant technical advantages, designed to assist the monitoring, the operation of measurement and checking equipment of business losses in indirect measurement facilities with current and/or potential transformers.

Furthermore, the present invention provides low cost when compared to currently available alternatives. The characteristics of inviolability, simplicity, precision and permanent verification are capable of providing physical and concrete evidence to support lawsuits between providers of electric utility services and the consumer.

The present invention also permits checking of the working performance of the current and potential transformers, in the field, and may assist in cases of installation failures, possible defects, fraud and diversions, this being a powerful tool in the management of electric power measurement systems in general.

The present invention can be used in any place or facility that has current and/or potential transformers installed in electric power measurement systems, whatever they are electric power utilities, private substations, and industrial facilities, among others.

Having described examples of preferred embodiments, it should be understood that the scope of the present invention encompasses other possible variations, and is only limited by the content of the appended claims, including potential equivalents therein.

The invention claimed is:

1. An individualized self-monitoring system for transformers in an electric power measurement installation, the system comprising:
   at least one self-monitoring current transformation unit which comprises: a current transformer in the electric power measurement installation, a time-integrated current meter in a series connection with a secondary winding of the current transformer, and a remote communication module connected to an output of the time-integrated current meter;
   a consumption unit or substation which receives electric current from the primary winding of the current transformer;
   an external measurement unit for measuring an electrical quantity received therein, wherein the external measurement unit is in a serial connection with a secondary circuit of the self-monitoring current transformation unit, and wherein the external measurement unit is configured for connection to the electrical power measurement installation; and
   a record and communication unit which receives and stores electrical quantity measured data sent by at least one of the remote communication module and the external measurement unit;
   wherein the consumption unit or substation is in a series connection with a primary circuit of the self-monitoring current transformation unit.

2. The system according to claim 1, wherein each self-monitoring current transformation unit has an output device for calibration of electrical quantity data measured by the time-integrated current meter of that self-monitoring current transformation unit.

3. The system according to claim 2, wherein each remote communication module of each self-monitoring transformation unit transmits the electrical quantity data, measured by the time-integrated current meter, to a tele-measurement station and an information reader/collector device.

4. The system according to claim 3, wherein the record and communication unit transmits the received and stored electrical quantity measured data to one among the tele-measurement station, the information reader/collector device, and the external measurement unit.

5. The system according to claim 4, wherein the record and communication unit has a mass storage to store the electrical quantity measured data.

6. The system according to claim 5, wherein the record and communication unit has a display that presents the measured data from the time-integrated current meters.

7. The system according to claim 2, further comprising:
   a handheld information reader/collector device that receives and stores measured data from at least one among the remote communications module, the record and communication unit, and the external measurement unit.

8. The system according to claim 7, wherein the information reader/collector device transmits the received and stored data to at least one among a tele-measurement station, the external measurement unit, and the record and communication unit.

9. The system according to claim 7, wherein at least one among the information reader/collector device, the record and communication unit, and the external measurement unit is configured to compare the data measured by the meters and data measured by the external measurement unit and to issue a diagnosis based on a result of comparing the data measured by the meters and the data measured by the external measurement unit.

10. The system according to claim 2, further comprising:
    a display configured to present the measured data for a certain time interval.

11. The system according to claim 2, wherein the self-monitoring current transformation unit has a mass storage to store the measured data thereby during a certain time interval.

12. An individualized self-monitoring system for transformers in an electric power measurement installation, the system comprising:
    at least one self-monitoring current transformation unit which comprises: a current transformer in the electric power measurement installation, a time-integrated current meter in a series connection with a primary winding of the current transformer, a time-integrated current meter in a series connection with a secondary winding of the current transformer, and a remote communication module connected to an output of each time-integrated current meter;
    a consumption unit or substation which receives electric current from the primary winding of the current transformer;
    an external measurement unit for measuring an electrical quantity received therein, wherein the external measurement unit is in a serial connection with a secondary circuit of the self-monitoring current transformation unit, and wherein the external measurement unit is configured for connection to the electrical power measurement installation; and
    a record and communication unit which receives and stores electrical quantity measured data sent by at least one of the remote communication module and the external measurement unit;
    wherein the consumption unit or substation is in a series connection with a primary circuit of the self-monitoring current transformation unit.

13. The system according to claim 12, wherein the self-monitoring current transformation unit has an output device for calibration of electrical quantity data measured by both time-integrated current meters.

14. The system according to claim 13, wherein the remote communication modules transmit the electrical quantity data, measured by each time-integrated current meter, to a tele-measurement station and an information reader/collector device.

15. The system according to claim 14, wherein the record and communication unit transmits the received and stored electrical quantity measured data to one among a tele-measurement station, an information reader/collector device, and the external measurement unit.

16. The system according to claim 15, wherein the record and communication unit has a mass storage to store the electrical quantity measured data.

17. The system according to claim 16, wherein the record and communication unit has a display that presents the measured data from the time-integrated current meters.

18. The system according to claim 13, further comprising:
a handheld information reader/collector device that receives and stores measured data from at least one among the remote communications module, the record and communication unit and the external measurement unit.

19. The system according to claim 18, wherein the information reader/collector device transmits the received and stored data to at least one among a tele-measurement station, the external measurement unit, and the record and communication unit.

20. The system according to claim 18, wherein at least one among the information reader/collector device, the record and communication unit, and the external measurement unit is configured to compare the data measured by the meters and data measured by the external measurement unit and to issue a diagnosis based on a result of comparing the data measured by the meters and the data measured by the external measurement unit.

21. The system according to claim 13, further comprising:
a display configured to present the measured data for a certain time interval.

22. The system according to claim 13, wherein the self-current monitoring transformation unit has a mass storage to store the measured data thereby during a certain time interval.

23. An individualized self-monitoring system for transformers in an electric power measurement installation, the system comprising:
at least one self-monitoring current transformation unit which comprises: a current transformer in the electric power measurement installation, a time-integrated current meter in a series connection with a secondary winding of the current transformer, and a remote communication module connected to the output of the time-integrated current meter;
at least one self-monitoring potential transformation unit which comprises a potential transformer in the electric power measurement installation, a time-integrated voltage meter in a parallel connection with the secondary winding of the potential transformer, and a remote communication module connected to the output of the time-integrated voltage meter;
a consumption unit or substation which receives electric current from the primary winding of the current transformer;
an external measurement unit for measuring an electrical quantity received therein, wherein the external measurement unit is in a serial connection with a secondary circuit of the self-monitoring current transformation unit, and wherein the external measurement unit is in a parallel connection with the secondary winding of the self-monitoring potential transformation unit, and wherein the external measurement unit is configured for connection to the electrical power measurement installation; and
a record and communication unit which receives and stores electrical quantity measured data sent by at least one of the remote communication module and the external measurement unit;
wherein the consumption unit or substation is in a series connection with a primary circuit of the self-monitoring current transformation unit.

24. The system according to claim 23, wherein the self-monitoring current transformation unit has an output device for calibration of electrical quantity data measured by time-integrated current meter, and wherein the self-monitoring potential transformation unit has an output device for calibration of the electrical quantity data measured by the time-integrated voltage meter.

25. The system according to claim 24, wherein the remote communication modules transmit the electrical quantity data, measured by each time-integrated current meter and each time-integrated voltage meter, to a tele-measurement station and an information reader/collector device.

26. The system according to claim 25, wherein the record and communication unit transmits the received and stored electrical quantity measured data to one among a tele-measurement station, an information reader/collector device, and the external measurement unit.

27. The system according to claim 26, wherein the record and communication unit has a mass storage to store the electrical quantity measured data.

28. The system according to claim 27, wherein the record and communication unit has a display that presents the measured data from the time-integrated current meter and the time-integrated electric voltage meter.

29. The system according to claim 24, further comprising:
a handheld information reader/collector device that receives and stores measured data from at least one among the remote communications module, the record and communication unit, and the external measurement unit.

30. The system according to claim 29, wherein the information reader/collector device transmits the received and stored data to at least one among a tele-measurement station, the external measurement unit, and the record and communication unit.

31. The system according to claim 29, wherein at least one among the information reader/collector device, the record and communication unit, and the external measurement unit is configured to compare the data measured by the meters and data measured by the external measurement unit and to issue a diagnosis based on a result of comparing the data measured by the meters and the data measured by the external measurement unit.

32. The system according to claim 24, further comprising:
a display configured to presents the measured data for a certain time interval.

33. The system according to claim 24, wherein the self-monitoring current transformation unit has a mass storage to store the measured data thereby during a certain time interval.

34. The system according to claim 24, wherein the self-monitoring potential transformation unit has a mass storage to store the measured data thereby during a certain time interval.

35. An individualized self-monitoring system for transformers in an electric power measurement installation, the system comprising:

at least one self-monitoring current transformation unit which comprises: a current transformer in the electric power measurement installation, a time-integrated current meter in a series connection with a primary winding of the current transformer, a time-integrated current meter in a series connection with a secondary winding of the current transformer, and a remote communication module connected to an output of each time-integrated current meter;

at least one self-monitoring potential transformation unit which comprises a potential transformer in the electric power measurement installation, a time-integrated voltage meter in a parallel connection with the secondary winding of the potential transformer, and a remote communication module connected to an output of the time-integrated voltage meter;

a consumption unit or substation which receives electric current from the primary winding of the current transformer;

an external measurement unit for measuring an electrical quantity received therein, wherein the external measurement unit is in a serial connection with a secondary circuit of the self-monitoring current transformation unit, and wherein the external measurement unit is in a parallel connection with the secondary winding of the self-monitoring potential transformation unit, and wherein the external measurement unit is configured for connection to the electrical power measurement installation; and a record and communication unit which receives and stores electrical quantity measured data sent by at least one of the remote communication module and the external measurement unit;

wherein the consumption unit or substation is in a series connection with a primary circuit of the self-monitoring current transformation unit.

36. The system according to claim 35, wherein the self-monitoring current transformation unit has an output device for calibration of electrical quantity data measured by both time-integrated current meters, and wherein the self-monitoring potential transformation unit has an output device for calibration of the electrical quantity data measured by the time-integrated voltage meter.

37. The system according to claim 36, wherein the remote communication modules transmit the electrical quantity data, measured by each time-integrated current meter and each time-integrated voltage meter, to a tele-measurement station and an information reader/collector device.

38. The system according to claim 37, wherein the record and communication unit transmits the received and stored electrical quantity measured data to one among a tele-measurement station, an information reader/collector device, and the external measurement unit.

39. The system according to claim 38, wherein the record and communication unit has a mass storage to store the electrical quantity measured data.

40. The system according to claim 39, wherein the record and communication unit has a display that presents the measured data from the time-integrated current meters and the time-integrated electric voltage meter.

41. The system according to claim 36, further comprising:
a handheld information reader/collector device that receives and stores measured data from at least one among the remote communications module, the record and communication unit, and the external measurement unit.

42. The system according to claim 41, wherein the information reader/collector device transmits the received and stored data to at least one among a tele-measurement station, the external measurement unit, and the record and communication unit.

43. The system according to claim 41, wherein at least one among the information reader/collector device, the record and communication unit, and the external measurement unit is configured to compare the data measured by the meters and data measured by the external measurement unit and to issue a diagnosis based on a result of comparing the data measured by the meters and the data measured by the external measurement unit.

44. The system according to claim 36, further comprising:
a display configured to presents the measured data for a certain time interval.

45. The system according to claim 36, wherein the self-monitoring current transformation unit has a mass storage to store the measured data thereby during a certain time interval.

46. The system according to claim 36, wherein the self-monitoring potential transformation unit has a mass storage to store the measured data thereby during a certain time interval.

* * * * *